United States Patent
Krasnoperova et al.

(10) Patent No.: US 8,015,511 B2
(45) Date of Patent: Sep. 6, 2011

(54) ADJUSTMENT OF MASK SHAPES FOR IMPROVING PRINTABILITY OF DENSE INTEGRATED CIRCUIT LAYOUT

(75) Inventors: Azalia Krasnoperova, Mahwah, NJ (US); Ian P Stobert, Hopewell Junction, NY (US); Klaus Herold, Poughquag, NY (US)

(73) Assignees: International Business Machines Corporation, Armonk, NY (US); InfineonTechnologies North America Corporation, Milpitas, CA (US)

( * ) Notice: Subject to any disclaimer, the term of this patent is extended or adjusted under 35 U.S.C. 154(b) by 308 days.

(21) Appl. No.: 12/348,331

(22) Filed: Jan. 5, 2009

(65) Prior Publication Data
US 2010/0175041 A1    Jul. 8, 2010

(51) Int. Cl.
*G06F 17/50* (2006.01)
(52) U.S. Cl. .............. 716/50; 716/51; 716/52; 716/53; 716/54; 716/55

(58) Field of Classification Search ............... 716/19, 716/20, 50–55
See application file for complete search history.

(56) References Cited

U.S. PATENT DOCUMENTS

| | | | |
|---|---|---|---|
| 7,503,028 B2 * | 3/2009 | Mukherjee et al. | 716/51 |
| 2004/0205688 A1 * | 10/2004 | Pierrat | 716/21 |
| 2007/0094959 A1 * | 5/2007 | Hu et al. | 52/220.2 |
| 2007/0226674 A1 * | 9/2007 | Haffner et al. | 716/19 |

* cited by examiner

*Primary Examiner* — Nghia M Doan
*Assistant Examiner* — Brian Ngo
(74) *Attorney, Agent, or Firm* — Yuanmin Cai

(57) ABSTRACT

Embodiments of the present invention provide a method for making mask shape adjustment The method includes creating a first mask shape; identifying one or more mask segments of the first mask shape as candidate mask segments of needing segment adjustment; applying an optical proximity correction (OPC) process to the first mask shape, the OPC process identifying at least one of the candidate mask segments as a constrained mask segment; applying a rotational adjustment to the constrained mask segment; and creating a second mask shape having the constrained mask segment being rotationally adjusted. A system and a machine-readable medium for performing the above method are also provided.

24 Claims, 13 Drawing Sheets

ADJUSTMENT OF MASK SHAPES FOR IMPROVING PRINTABILITY OF DENSE INTEGRATED CIRCUIT LAYOUT

FIELD OF THE INVENTION

The present invention relates generally to design and manufacturing of integrated circuits. In particular, it relates to system and method of creating and adjusting patterns on a lithographic mask designed for dense integrated circuit layout.

BACKGROUND OF THE INVENTION

Fabrication of semiconductor integrated circuits usually includes a series of processing steps that may be organized or grouped into different process modules. One process module may be, for example, a patterning process module that includes steps in creating a pattern or patterns of one or more devices on a silicon wafer. For example, this patterning process module may include a lithographic step during which patterns of devices represented by imprints on a photo-mask may be projected, through photo-exposure, onto a photo-sensitive resist (or "photo-resist") material that is applied on top of a silicon wafer to form patterns. Subsequently, the patterns formed in the photo-resist material may be transferred to an underneath silicon wafer through, for example, an etching process. As is known in the art, patterns on a photo-mask are usually a collection of polygons, whose shapes may be designed based upon final device shapes to be created desirably in the silicon wafer. The polygons on the photo-mask may be made either opaque or transparent to light, depending upon the types (positive or negative) of photo-resist materials being used.

In general, optical systems used in photo-exposure, also known as lithographic exposure, have certain limitations on achievable feature resolution. For example, there is always a limit on the size and density of polygons, in unit area, that may be transferred from a photo-mask to a silicon wafer by an optical system with reasonable satisfaction and acceptable quality. However in recent years, despite steady improvement in optical systems, resolutions of these optical systems have not been able to keep up with the ever increasing demand of manufacturing semiconductor devices of smaller feature sizes on a single silicon wafer. Under this circumstance, as an alternative measure to meet the demand for optical system resolution, the concept of Optical Proximity Correction (OPC) was introduced.

In an ideal world, forms of device shapes manufactured on a photo-mask shall truly reflect those to be created or imprinted on a semiconductor wafer. Nevertheless, the concept of an OPC technique is to manipulate or pre-distort forms of device shapes to be manufactured on the photo-mask, as is well known in the art, such that the pre-distorted shapes imprinted on the photo-mask, when being transferred to a wafer through photo-exposure and etching process, will eventually produce desired device shapes on the wafer. OPC is a software algorithm that takes a set of input design data for a particular lithography step, transforms that input design data by applying a set of pre-determined algorithms and/or models, and finally outputs a new set of design data. This new set of design data is then used in writing or creating patterns in a physical medium such as a photo-mask.

Generally, an OPC process shall produce polygon mask shapes, represented by the new set of design data, which are manufacturable on a semiconductor wafer through existing photo-mask process and/or wafer lithography process. However, the existing photo-mask process and/or wafer lithography process usually also requires a set of stringent conditions to be met by the polygons. These conditions impose certain constrains on the degree of extent that these polygons of mask shapes may be modified during an OPC process. Considering the ever increasing density of polygons being used in masks for manufacturing semiconductor devices, these conditions are becoming harder and harder to be met and satisfied. In the event that an OPC tool encounters a condition such that it can no longer produce polygons that meet the required manufacturability, one possible outcome of the OPC tool is to produce a "best possible" solution that is not necessarily acceptable by the pre-set manufacturing quality requirement.

Traditionally, OPC tools have used techniques to modify polygons for desired device shapes according to certain simplified rules. For example, polygons edges may be first broken into several segments that are allowed to move or to be adjusted in fixed directions of "in" or "out" of polygons. Subsequently, optical simulation is performed on the pattern to calculate edge placement error that may be anticipated on the wafer. Based upon the edge placement error, one or more segments may be further moved in a translational movement in a direction that may compensate or reduce that edge placement error. For example, OPC may make translational movement of the segment such that the moved or adjusted segment remains parallel to the original segment. More specifically, if an original mask design contains polygons with only 90° or 270° vertices, then the mask shape designed and finally output by OPC after including the effect of segment movement will still be polygons and with only 90° or 270° vertices as well. On the other hand, if the original mask design, which is fed into an OPC process as input design data, has segments of 45° orientation, then these segments of 45° orientation will retain the same orientation in the final mask design output by OPC. The extent that a segment may move is pre-determined, as is known in the art, by models used in the OPC.

SUMMARY OF EMBODIMENTS OF THE INVENTION

A conventional OPC process forms mask shapes as derived from design shapes. In particular, a mask segment is formed and adjusted to move in such a way that the mask segment remains parallel to the associated design segment. In dense 2D environments, this conventional OPC process often creates situations where mask movements are restricted due to vertices encountering minimum allowable space separation between them. According to embodiment of the present invention, mask shape segments formed during an OPC process are allowed, in certain conditions, to become rotated with respect to the associated design segments. In densely packed 2-dimensional configurations, this additional degree of freedom allows for generation of mask shapes with less mask manufacturing violations and better image control, on the wafer.

Embodiments of the present invention provide a method of making mask shape adjustment. The method includes creating a first mask shape; identifying one or more mask segments of the first mask shape as candidate mask segments of needing segment adjustment; applying an optical proximity correction (OPC) process to the first mask shape, the OPC process identifying at least one of the candidate mask segments as a constrained mask segment; applying a rotational adjustment to the constrained mask segment; and creating a second mask shape having the constrained mask segment being rotationally adjusted. In one embodiment, the first mask shape is created from a design shape input, and the mask segments include edge segments of the first mask shape.

In one embodiment, applying the OPC process includes optically simulating a printed image using the first mask shape; calculating an amount of move needed by each of the candidate mask segments based upon the simulated printed image; and moving the candidate mask segments according to the amount of move calculated and allowed by conventional OPC rules.

In another embodiment, identifying the constrained mask segment includes finding at least one of the candidate mask segments that encounters movement constrains imposed by the conventional OPC rules when moving according to the amount of move calculated by the OPC process.

According to one embodiment, applying the rotational adjustment includes assigning attributes of a rotational move type to the constrained mask segment, and subsequently moving the constrained mask segment according to the attributes of the rotational move type.

In one embodiment, applying the rotational adjustment to the constrained mask segment includes splitting the constrained mask segment into two new mask segments having a common end point at a middle of the constrained mask segment; moving the common end point outwards laterally to cause the two new mask segments to expand and rotate in opposite directions, the two new mask segments forming a triangle shape with the constrained mask segment before splitting. In addition, two angles formed by each of the two new mask segments with the constrained mask segment before splitting are each substantially close to 45 degrees.

In another embodiment, applying the rotational adjustment to the constrained mask segment includes expanding and making translational move of the constrained mask segment to create an expanded mask segment; splitting the expanded mask segment into two new mask segments having a common end point; and rotating at least one of the two new mask segments at the common end point by a predetermined degrees.

According to one embodiment, the method further includes expanding and making translational move of the two new mask segments; and covering at least one acute angle formed by the expanded two new mask segments by introducing one or more additional mask segments thereupon.

BRIEF DESCRIPTION OF THE DRAWINGS

The present invention will be understood and appreciated more fully from the following detailed description of the invention, taken in conjunction with the accompanying drawings of which.

Figure 1:
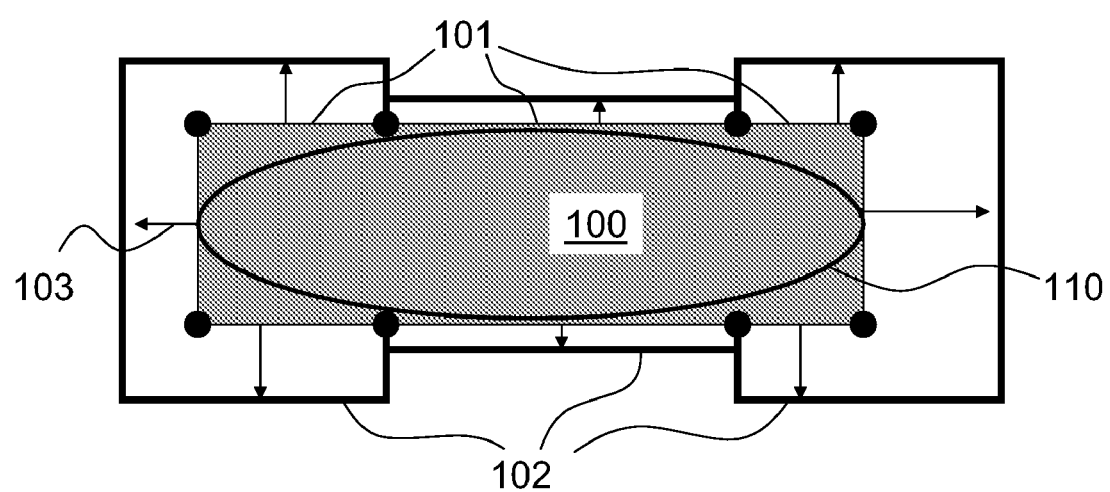
FIG. 1 is a simplified illustration of a design shape of a semiconductor device and a photo-mask shape created for the design shape according to OPC rules that are known in the art.

It will be appreciated that for simplicity and clarity of illustration, elements shown in the drawings have not necessarily been drawn to scale. For example, the dimensions of some of the elements may be exaggerated relative to other elements for clarity.

DETAILED DESCRIPTION OF THE EMBODIMENTS

In the following detailed description, numerous specific details are set forth in order to provide a thorough understanding of embodiments of the invention. However, it will be understood by those of ordinary skill in the art that embodiments of the invention may be practiced without these specific details. In other instances, well-known methods and procedures have not been described in detail so as not to obscure the embodiments of the invention.

Some portions of the detailed description in the following are presented in terms of algorithms and symbolic representations of operations on electrical and/or electronic signals. These algorithmic descriptions are representations may be the techniques used by those skilled in the electrical and electronic engineering and VLSI chip design to convey the substance of their work to others skilled in the art.

An algorithm is here, and generally, considered to be a self-consistent sequence of acts, actions, or operations leading to an expected or desired result. These include but are not limited to physical manipulation of physical quantities. Usually, though not necessarily, these quantities take the form of electrical or electronic signals capable of being stored, transferred, combined, compared, converted, and otherwise manipulated. It has proven convenient at times, principally for reasons of common usage, to refer to these signals as bits, values, elements, symbols, characters, terms numbers or the like. It shall be understood however that all of these and similar terms are to be associated with the appropriate physical quantities and are merely convenient labels applied to these quantities.

In the following description, various figures, diagrams, flowcharts, models, and descriptions are presented as different means to effectively convey the substances and illustrate different embodiments of the invention that are proposed in this application. It shall be understood by those skilled in the art that they are provided merely as exemplary samples, and shall not be constructed as limitation to the invention.

FIG. 1 is a simplified illustration of a design shape of a semiconductor device and a photo-mask shape created for the design shape according to OPC rules that are known in the art. In FIG. 1, design shape 100, also known as drawn shape, is represented by the shaded rectangular area. It represents the ideal device shape to be manufactured in a silicon wafer. In an ideal world, a printed image or printed shape created by a photo-exposure process from a photo-mask on a silicon wafer shall closely resemble the original design shape or drawn shape. However in reality, the printed image, for example printed image 110, may be caused to deviate from the original design shape 100 by various factors such as, for example, non-linearity of the photo-exposure process used in creating the printed image or printed shape. Therefore, printed image or printed shape 110 may be more or less different from design shape 100 in either shape, principal dimensions (width, length), or both, as being demonstratively illustrated in FIG. 1 by the oval shape of printed image 110.

In order to compensate for differences between, for example, printed image or printed shape 110 and design shape 100, during the process of creating photo-mask for the lithographic exposure, design shape 100, which shall be very close to the mask shape in an ideal world, may be substituted by a mask shape 102 which is different from design shape 100. Obviously mask shape 102 is related to and may be derived from design shape 100. The exact form of mask shape 102 may be determined through well-known OPC processes and is demonstratively illustrated in FIG. 1. For example, during an OPC process, edges or perimeter of design shape 100 may first be divided into, for example, eight (8) segments 101 (segments between black dots in FIG. 1) according to a set of pre-determined OPC rules. Each segment may subsequently be adjusted or moved by a certain amount and in a certain direction as being indicated by arrows 103 in FIG. 1. Both the amount and the direction of the movement are generally decided by the OPC process. For example, directions of movement of the segments generally follow normal to their respective segments on the design shape 100. Mask shape 102, which is the output of the OPC process used and thus known as OPC mask shape sometimes, generally has segments that are parallel to their associated segments of design shape 100.

Figure 2:
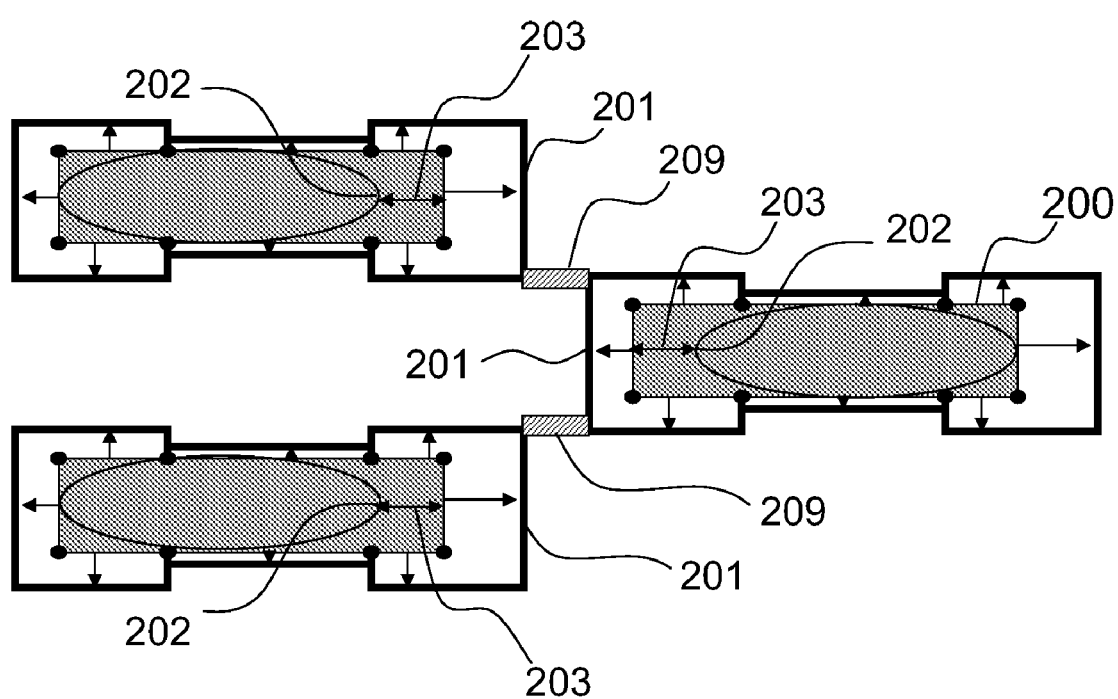
FIG. 2 is a simplified illustration of design shapes of multiple semiconductor devices and their corresponding mask shapes in a dense device density environment as is known in the art.

FIG. 2 is a simplified illustration of design shapes of multiple semiconductor devices and their corresponding mask shapes in a dense device density environment as known in the art. In particular, FIG. 2 illustratively shows three mask shapes and their respective design shapes 200 (shaded areas). In some instances, certain mask segments, for example segments 201, of the three mask shapes may be in positions where they cannot move further due to, for example, a set of pre-set constraints 209 which requires a minimum separation among the mask shapes. As is known in the art, constraints 209 may be imposed by, for example, mask manufacturing limit in order not to manufacture spaces that are smaller than certain values. Constraints 209 may also be imposed by a wafer lithography process as a condition beyond which excessive variability or sensitivity to process variations may start to occur. As a result and based upon current OPC practice, constraints 209 may lead to creation of printed images 202 (ovals) that do not extend to the desired edge of their respective drawn shapes or design shapes 200, leaving them short by a certain amount 203. The above conditions are often encountered in dense device patterns where many polygon vertices are jammed in a small space.

Figure 3:
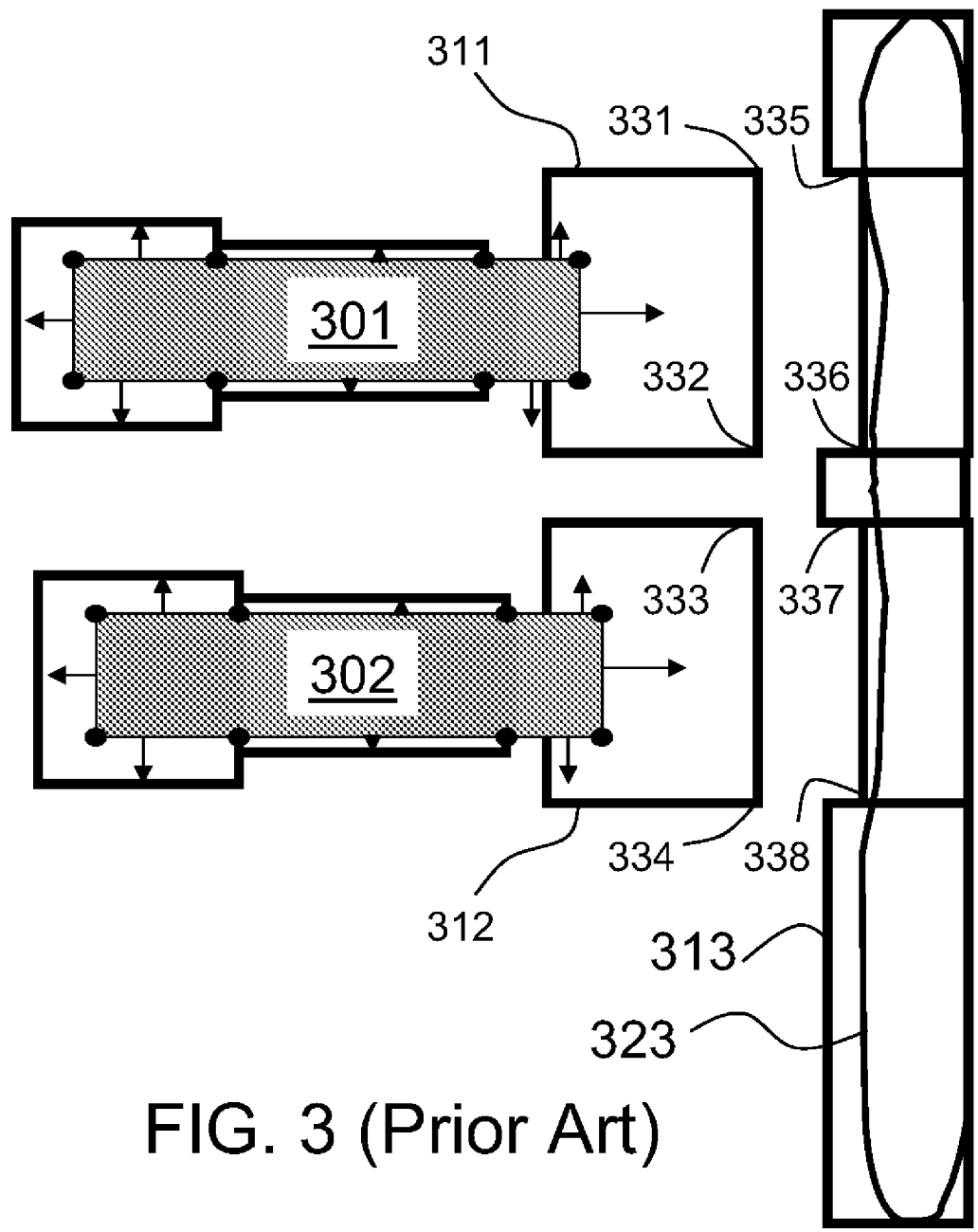
FIG. 3 is another simplified illustration of design shapes of multiple semiconductor devices and their corresponding mask shapes in a dense device density environment as is known in the art.

FIG. 3 is another simplified illustration of design shapes of multiple semiconductor devices and their corresponding mask shapes in a dense device density environment as is known in the art. Here, mask shapes 311 and 312 may be created based upon a conventional OPC procedure for design shapes 301 and 302 (shaded areas). However, certain segments of mask shapes 311 and 312, for example segments between points 331 and 332 and between points 333 and 334, may face a neighboring mask shape 313 of vertical lines and thus may subsequently cause mask shape 313 to create recessed segments between points 335 and 336 and between points 337 and 338 in order to accommodate mask shapes 311 and 312. The small spaces between opposing segments 331-332 and 335-336, and between opposing segments 333-334 and 337-338, are known for creating bad conditions, particularly with small process window, for printing vertical shape 323. Apparently, printed shape or printed image 323 is different from mask shape 313 and may be more different from its original design shape (not shown), which will be similar to mask shape 313 except with no recessed segments between points 335 and 336 and between points 337 and 338. It is apparent that if lengths of recessed segments 335-336 and 337-338 be made smaller or shorter, printed shape 323 may resemble its original design shape better.

Figure 4:
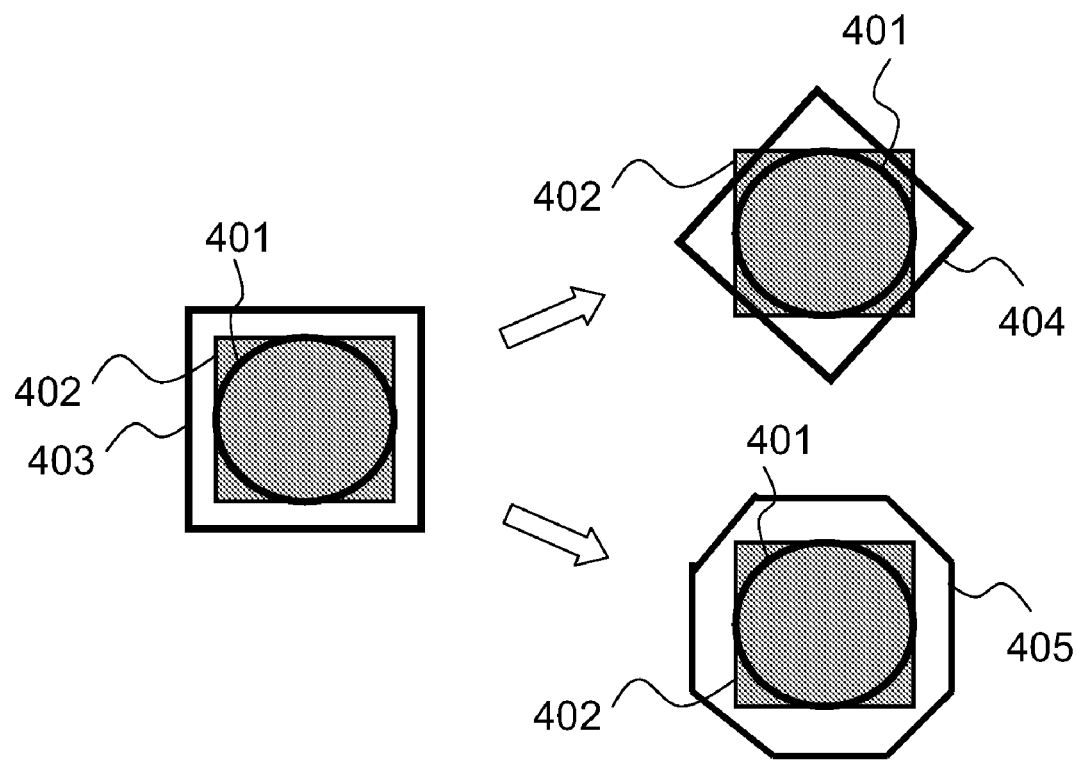
FIG. 4 is a simplified illustration of geometrical relationship between photo-mask shapes and actual images printed on a wafer.

FIG. 4 is a simplified illustration of geometrical relationship between photo-mask shapes and actual images printed on a wafer. Here, it is assumed that wavelength of light used in the photo-exposure process is significantly larger than dimensions of design shapes to be printed on the wafer. Under this circumstance, present invention makes an observation that a polygon on a photo-mask may be printed on a wafer in a form of circle regardless of the precise configuration of shape on the mask: whether the shape is a square with vertical and horizontal edges, a square being rotated 45 degree, or a hexagon. For example, FIG. 4 illustrates a design shape for a contact hole 402 to be printed on a wafer. When the size of contact hole 402 becomes smaller, in particular when the size becomes significantly smaller than the wavelength of light used in the photo-exposure process (for example a contact hole of 40~60 nm versus 193 nm wavelength of light), polygons of different shapes on a photo-mask such as polygon 403, 404, or 405 may be printed on the wafer in a circular shape 401 regardless of the exact shape or orientation of the polygon. In other words, masks of square shape 403 with vertical and horizontal edges, square shape 404 with 45 degree rotation, or hexagon shape 405 will all produce a printed image of contact hole 401 of similar circular shape.

Based upon above observation, embodiments of the present invention provide a method of applying OPC in processing design data such that the method removes geometrical constraints on the movement of mask shapes imposed during a conventional OPC process. According to one embodiment, segments of a mask shape are allowed to make translational as well as rotational move. In the following, a "Manhattan type" mask shape will be used as an example for explanation for simplicity but without losing generality. In a "Manhattan type" mask shape, all edges or edge segments may be considered either vertical or horizontal. In this instance, if a vertical segment of the mask shape is denoted by coordinates of its end points (x1, y1) and (x1, y2), then making a translational only move of the vertical segment by an amount "a" in x-direction and an amount "b" in y-direction will result in a new mask shape segment with coordinates (x1+a, y1+b) and (x1+a, y2+b). On the other hand, according to embodiment of the present invention, the mask shape segment is now allowed to make both translational and rotational move during the OPC process, which will be referred to as a modified or improved OPC process. Thus, this modified OPC process will create a new mask shape segment with coordinates, for example (x1+a, y1+b) and (x1+a1, y2+b1), that are different from the above translational move. For example, in the modified OPC process, the amount of change in coordinate "a1" may not be the same as "a", and "b1" may not be the same as "b".

Embodiment of the present invention provides an improved OPC method or process that may include, among others, identifying places where freedom of mask segment movement may be needed. In general, freedom of movement is needed in a dense two-dimensional (2D) layout. A "dense 2D layout" is generally considered or characterized as a layout where many vertices from one or more polygons are in close proximity and in one unit area. Embodiments of the method or process may additionally include marking these segments with special "markers" or remembering these segments as potential candidates for rotational transformation of move during the OPC process.

Starting from a conventional OPC process, segments of a mask shape may be formed and at least some of them may be moved in accordance with techniques commonly known in the art. When a mask segment can no longer move due to constraints set up by the conventional OPC rules but nevertheless conditions for printability of wafer image (for this and/or surrounding mask segments) have not been met yet, according to one embodiment of the present invention, a process of rotational movement may be employed to further improve printability conditions for the concerned mask segments, if the mask segment is one of the candidates identified in a previous step as needing freedom of movement.

Since constrains on movement of vertices are removed, according to embodiment of the present invention, mask segments have now more freedom to move and/or adjust that may result in better printed images or printed shapes on a wafer. According to one embodiment, the movement, particularly rotational movement, may be applied to only certain segments that are considered critical during the course of the OPC process. By allowing more freedom for movement in the formation process of polygons for mask shapes, fewer manufacturability restrictions may be encountered and this may result in more faithful images on the wafer.

Figure 5:
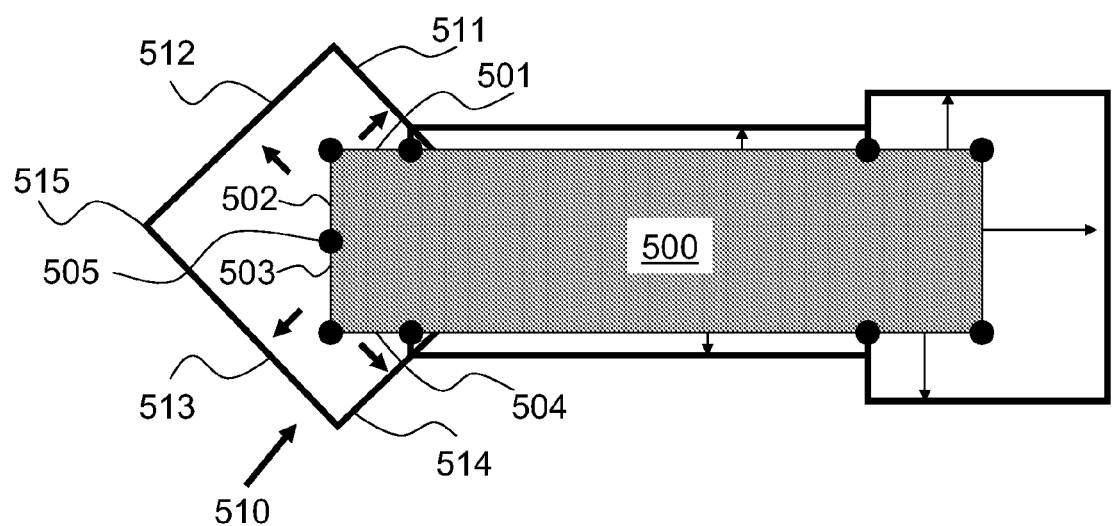
FIG. 5 is a demonstrative illustration of a method of making mask shape adjustment according to one embodiment of the present invention.

FIG. 5 is a demonstrative illustration of a method of making mask shape adjustment according to one embodiment of the present invention. For simplicity without losing generality, FIG. 5 illustrates only one design shape 500 (shaded area) of rectangle, and only edge elements on the left side of design shape 500 will be explained in the following as going through a process of OPC mask shape adjustment. A person skilled in the art shall appreciate that the process described below may be equally applied to situations of more than one design shapes and to any edge elements of the design shapes that may need mask segment adjustment.

More specifically, according to one embodiment, the method may split a left vertical edge segment of design shape 500 into two (2) new mask segments 502 and 503, and allow mask segments 502 and 503 to move, expand and rotate about 45 degrees, for example, in opposite directions to become mask segments 512 and 513, respectively. Alternatively, the method may move a common end point 505 at the middle of the vertical edge element to move outwards laterally to become common end point 515, and cause mask segments 502 and 503 to move, expand, and rotate in opposite directions to become mask segments 512 and 513. The move, expansion, and/or rotation may depend on the proximity of one or more neighboring mask shapes (not shown) to design shape 500. Here, a person skilled in the art will appreciate that embodiments of the present invention are not limited in the above respect and mask segments 502 and 503 may be moved and rotated by more or less than 45 degrees. For example, the translational as well as rotational movement of mask segments 502 and 503 may depend on, and be influenced by, positions of adjacent mask shapes as often being encountered in a dense 2D situation.

Similarly, mask segment 501 may be moved, expanded, and rotated to become mask segment 511, and mask segment 504 may be moved, expanded, and rotated to become mask segment 514. During the OPC process, it may be necessary to associate mask segments 511-514 with mask segments 501-504 because, as is known in the art, the amount of movement of each mask segment may be determined by the original design shape 500 (or drawn shape) which in general serves as starting mask segment 501-504. As a result of the above adjustment, the above modified OPC process may define or create a mask shape 510 for the left portion of design shape 500. Similarly, embodiments of the method may also be applied to the right portion of design shape 500 for moving, rotating, and defining certain mask segments, depending on proximity of one or more neighboring mask shapes.

Figure 6:
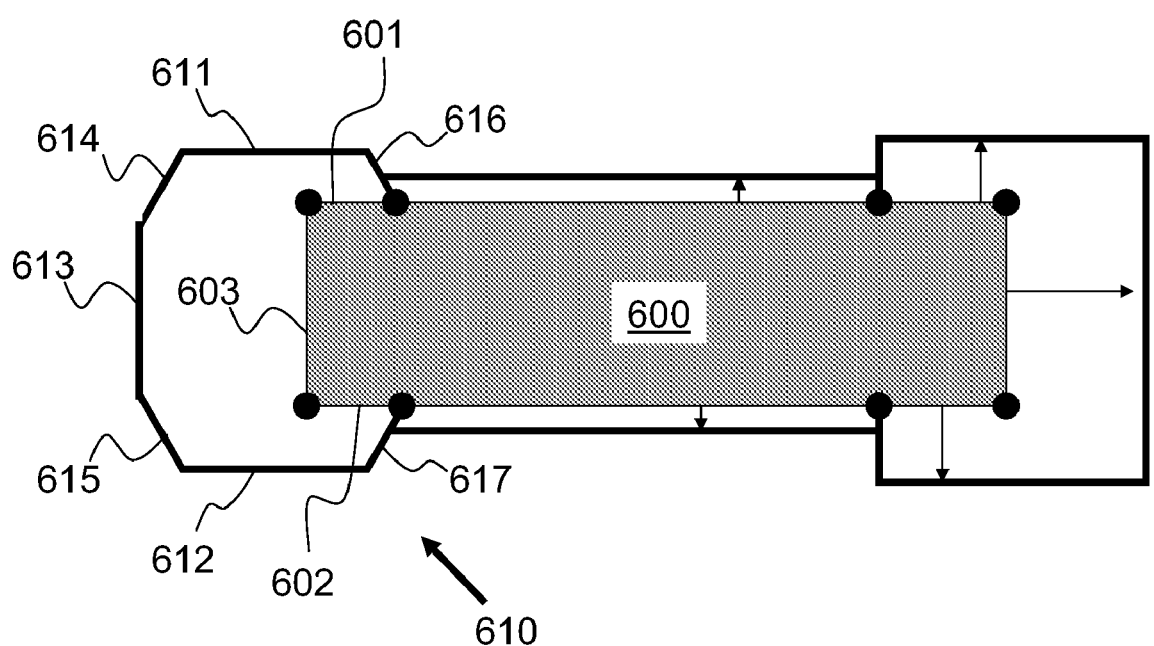
FIG. 6 is a demonstrative illustration of a method of making mask shape adjustment according to another embodiment of the present invention.

FIG. 6 is a demonstrative illustration of a method of making mask shape adjustment according to another embodiment of the present invention. Similar to FIG. 5, FIG. 6 illustrates only one design shape 600 (shaded area) of rectangle, and only edges on the left side of design shape 600 will be used as an example to explain how mask shapes or mask segments may be moved. In one embodiment, the method may include using edge segments (601-603) of design shape 600 as initial mask segments of a first mask shape, and based on edge segments (601-603) to create a second mask segments (611-617) of a multi-faceted polygon shape 610 at the left side of design shape 600. More specifically, mask segments 611, 612, and 613 may be considered as being derived from edge segments 601, 602, and 603 of design shape 600, and may maintain the same orientations as their original edge segments 601, 602, and 603. In the meantime, new mask segments 614, 615, 616, and 617 may be introduced having orientations that are different from those of design segment 601-603. Mask segments 614-617 may be created to avoid conflicting neighboring mask shapes connecting mask segments 601-603 and possible other mask segments. A similar approach may be equally applied to the right portion of design shape 600 as well.

Figure 7:
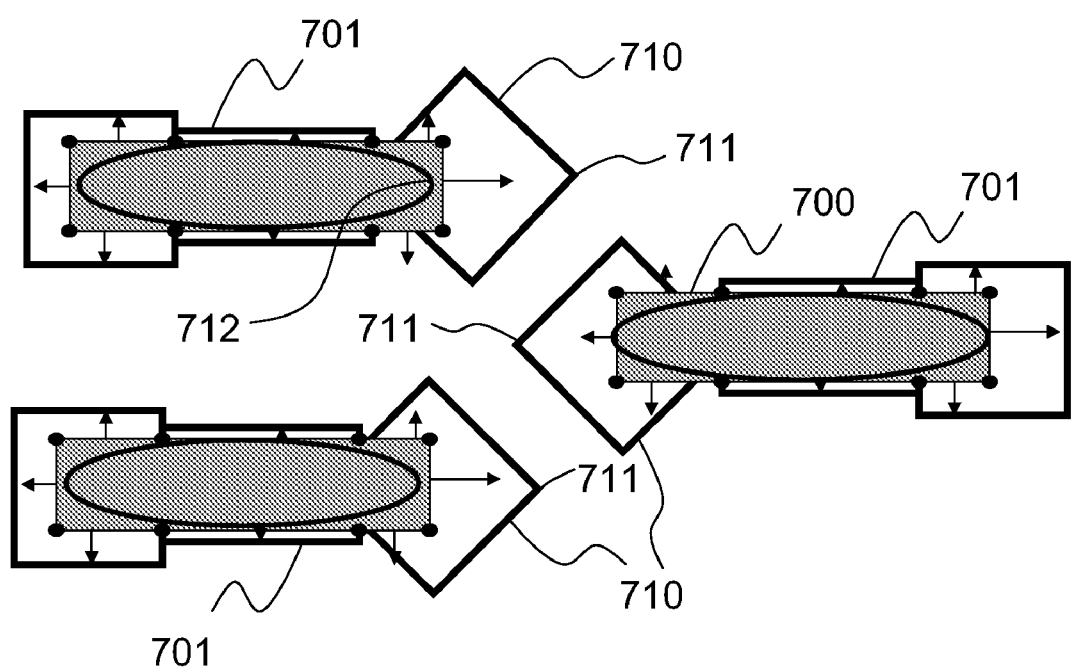
FIG. 7 is a demonstrative illustration of a method of making mask shape adjustment in a dense device density environment according to one embodiment of the present invention.

FIG. 7 is a demonstrative illustration of a method of making mask shape adjustment in a dense device density environment according to one embodiment of the present invention. More specifically, FIG. 7 illustrates three densely placed design shapes 700 and their corresponding mask shapes 701 of polygon shapes. At the end of the three polygons where they face each other, mask segments 710 of respective mask shapes were rotated. The rotations of mask shapes 710 are made in such a way that they allow the furthest point 711 of mask shapes 710 to move far enough without encountering constraints. In other words, constrains imposed on mask shapes 710 by conventional OPC rules (such as requiring a minimum space between two neighboring mask shapes) are at least partially removed and/or mitigated. As a result, when being made into a physical mask, this affords sufficient light to pass onto the particular ends of mask shapes 701 and creates printed image 712 (illustrated by the oval) that is formed in a location sufficiently close to that of original design shape 700.

According to embodiments of the present invention, allowing freedom of movement may also improve imaging conditions in situations even when constraints of mask manufacturing process were not met. These situations may include, for example, a condition known as "common run length" even when there are no vertex-to-vertex movement restrictions were met. This "common run length" condition may impose difficulties for imaging because the imaging process may become sensitive to mask variations. Through reducing "common run length" by applying methods of mask polygon reshaping according to embodiments of the present invention, as being illustrated below in FIG. 8, improved manufacturing conditions on wafer may be obtained.

Figure 8:
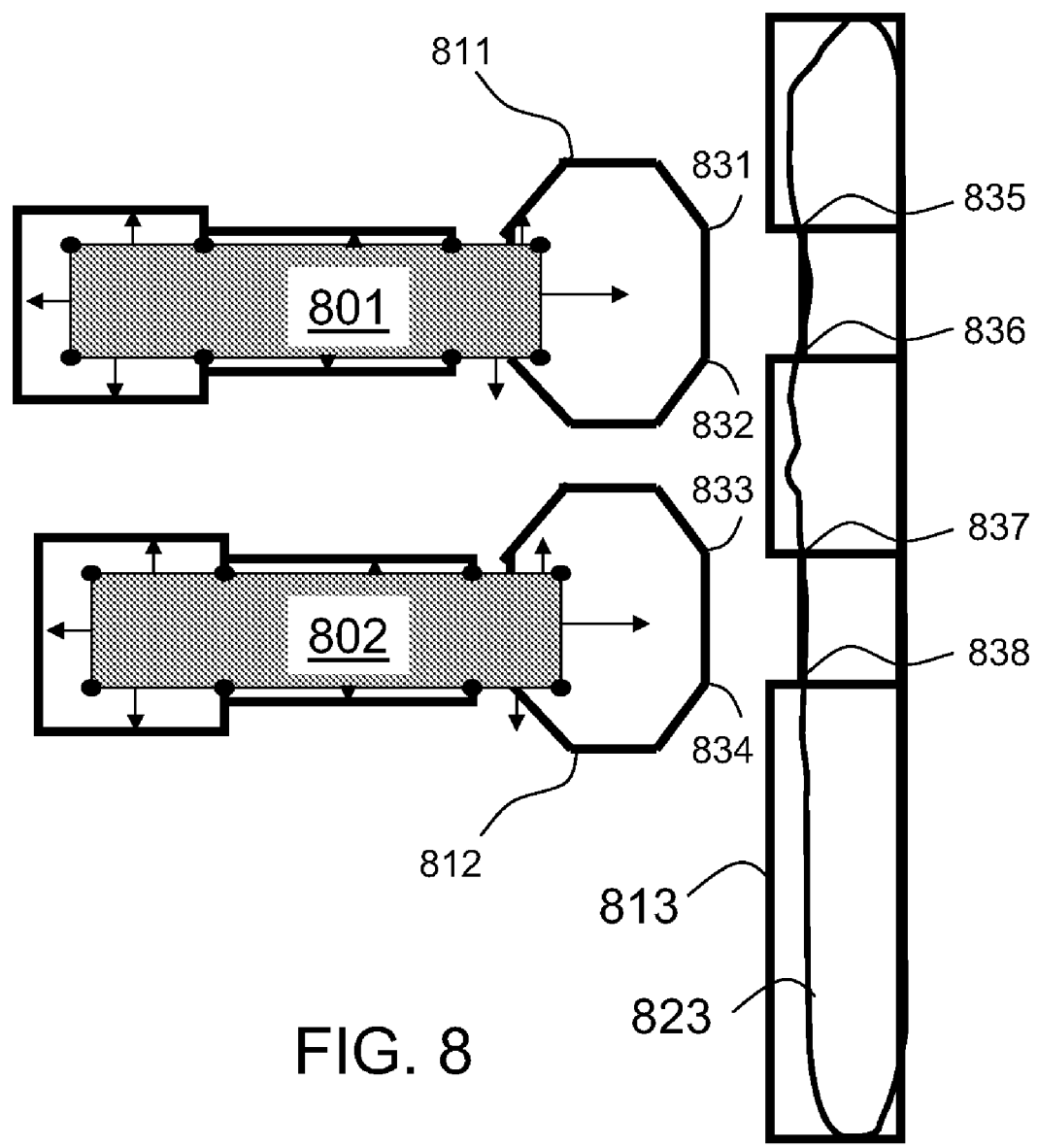
FIG. 8 is a demonstrative illustration of a method of making mask shape adjustment in a dense device density environment according to another embodiment of the present invention.

FIG. 8 is a demonstrative illustration of a method of making mask shape adjustment in a dense device density environment according to another embodiment of the present invention. For example, FIG. 8 illustrates design shapes 801 and 802 and mask shapes 811 and 812 that are created for the right side of design shapes 801 and 802. Mask shapes 811 and 812 are created according to embodiment of the present invention to have a multi-faceted polygon shape. By comparing with mask shapes 311 and 312, which are created according to a conventional OPC process as being illustrated in FIG. 3, mask segments between points 831 and 832 in FIG. 8 are much shorter than those between points 331 and 332 in FIG. 3. Similarly, mask segments between points 833 and 834 in FIG. 8 are much shorter than those between points 333 and 334 in FIG. 3. In other words, the two mask segments in FIG. 8 have reduced "common run length" with vertical mask shape 813 between points 835 and 836 and between points 837 and 838. This consequently allows more lights to be delivered to small spaces such as those confined to the exterior of the areas between mask segments 831-832 and 835-836, and between mask segments 833-835 and 837-838. Because of reduced common run lengths of opposing segments, vertical mask shape 813, when being transferred to a semiconductor wafer, may create a printed image or printed shape 823 which represents better the original design shape or drawn shape than printed image or printed shape 323 as illustrated in FIG. 3.

Figure 9:
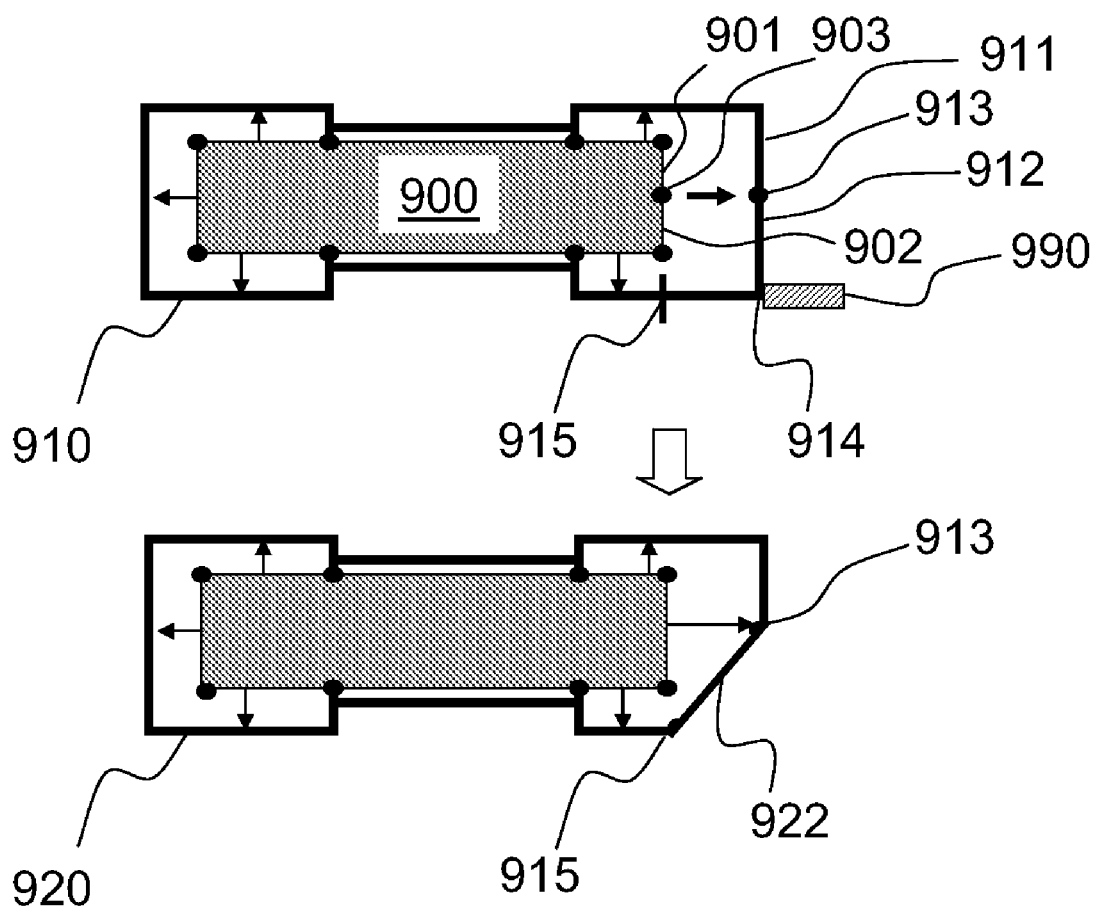
FIG. 9 is a simplified graphical illustration of a method of forming mask shapes according to one embodiment of the present invention.
Figure 10:
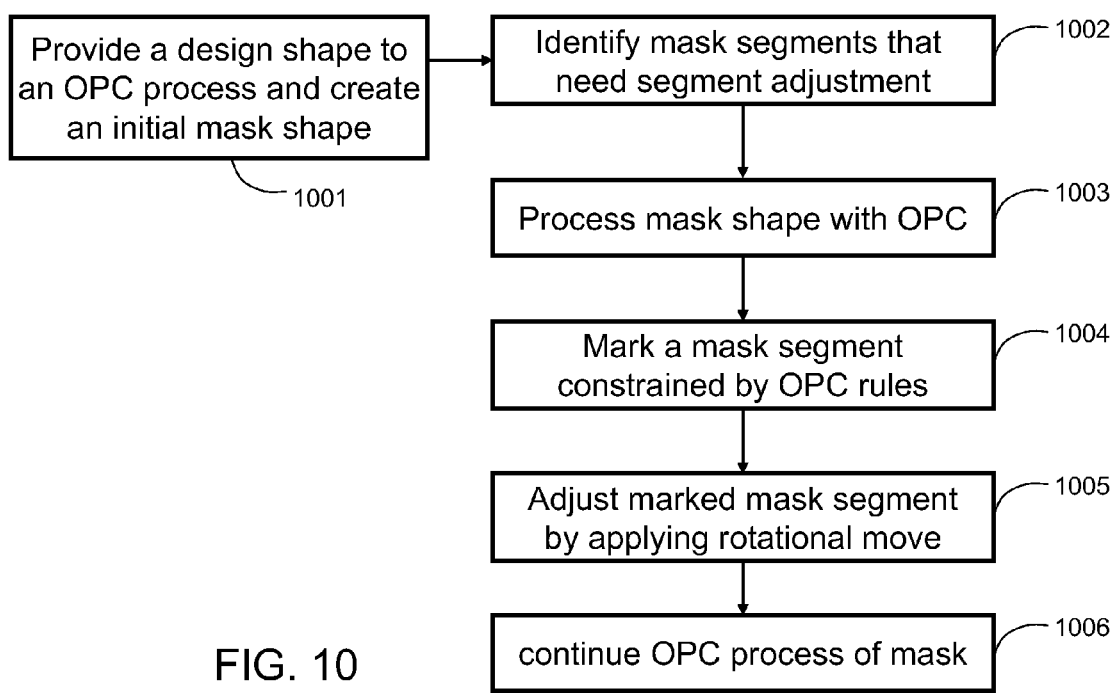
FIG. 10 is a flowchart illustration of embodiments of the method shown in FIG. 9.

FIG. 9 is a simplified graphical illustration of a method of forming mask shapes and FIG. 10 is a flowchart illustration of the method according to embodiments of the present invention. According to one embodiment, the method includes providing a design shape 900 to an OPC process and using the design shape as an initial mask shape at step 1001. The initial mask shape may subsequently go through a mask shape adjustment process. It is anticipated that certain edge segments of this initial mask shape may encounter movement restrictions, caused by conventional OPC rules, during an OPC process. Therefore at a next step 1002, the method may identify one or more mask segments of the initial mask shape (or design shape) as candidate mask segments of needing mask shape adjustment. For example, the method may identify mask segments 901 and 902 of edge segments of the mask shape in FIG. 9 as possible candidates of needing segment movement including translational and/or rotational movement. Following the identification, embodiment of the method may then proceed to process data of the mask shape with an OPC process at step 1003. The OPC process may optically simulate a printed image using the initial mask shape; calculate an amount of move needed by each of the candidate mask segments based upon the simulated printed image; and move the candidate mask segments according to the amount of move calculated and allowed by conventional OPC rules to create a mask shape 910.

Nevertheless, at least one of the mask segments, such as mask segment 902, may encounter certain movement constrains imposed by the conventional OPC rules. This mask segment may be identified and marked with certain "marker" as a constrained mask segment at step 1004. The method may then proceed at step 1005 to make adjustment of the marked constrained mask segment by making rotational move, for example, in accordance with embodiments of the present invention. Adjustment of constrained mask segment 902 may be described below in more details. Following the adjustment, the mask shape 920 with adjusted constrained mask segment 902 may go through further OPC process at step 1006.

Being associated with a same segment end point 903 on the initial mask shape, mask segments 901 and 902 may be moved outwards laterally by a same amount to become mask segments 911 and 912 in FIG. 9, and segment end point 903 may correspondingly be moved to become segment end point 913 between mask segments 911 and 912. Next, it is assumed that mask segment 912 encounters movement restriction 990. According to one embodiment of the present invention, mask segment 912 may be rotated to become mask segment 922. The adjustment and/or rotation may be accomplished by moving vertex 914 of mask segment 912 laterally, for example, by an amount of close to the length of segment 912 to create a new vertex 915. As a result, this may create a 45-degree rotated mask segment 922 connecting vertex 915 with segment end point 913.

Here, it shall be appreciated that embodiments of the present invention may not be restricted to this segment rotation of 45-degree and other degrees of rotation may be contemplated as well. However, currently available commercial tools for OPC may be able to handle 45-degree mask segment rotations relatively better than other degrees of angles. In addition, the commercial OPC tools also have in their arsenal appropriate commands to handle other vertex movement.

Figure 11:
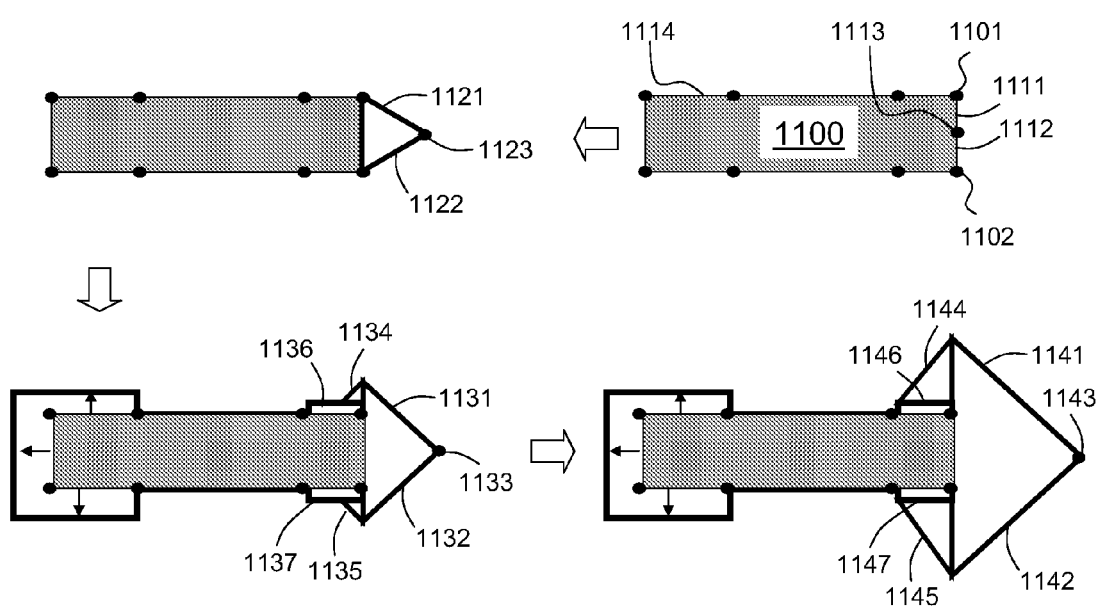
FIG. 11 is a simplified graphical illustration of a method of forming mask shapes according to another embodiment of the present invention.
Figure 12:
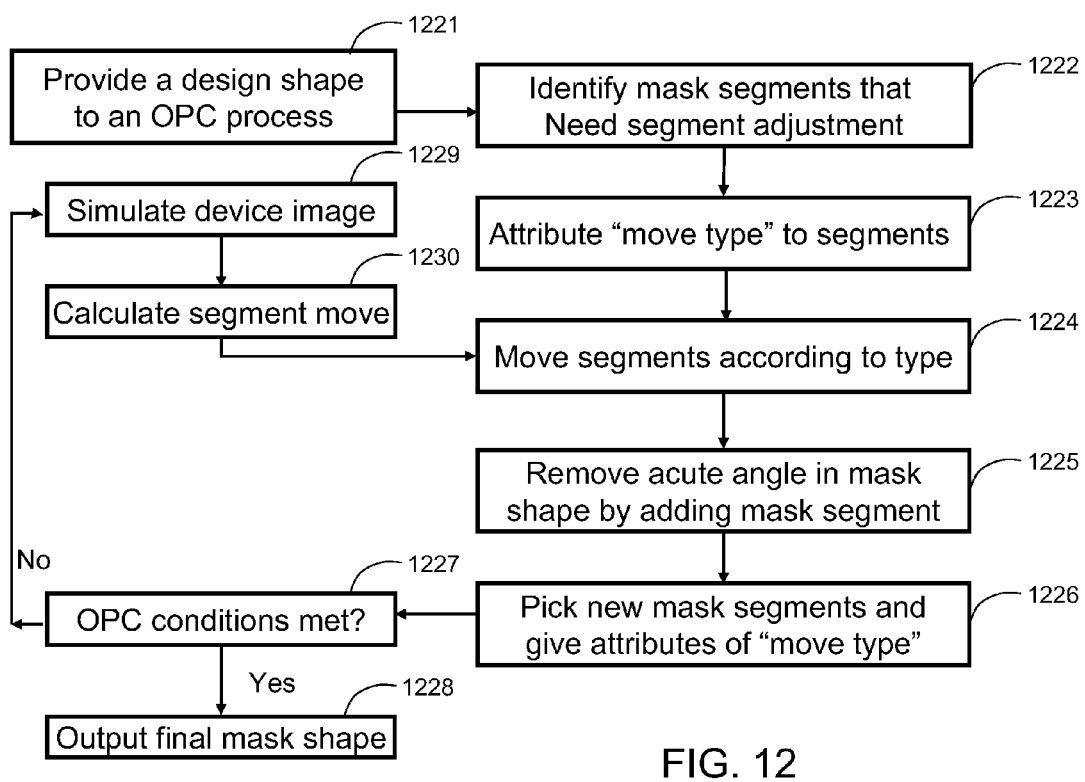
FIG. 12 is a flowchart illustration of embodiments of the method shown in FIG. 11.

FIG. 11 is a simplified graphic illustration of a method of forming mask shapes and FIG. 12 is a flowchart illustration of the method according to another embodiment of the present invention. In one embodiment, the method includes providing a design shape 1100 to an OPC process and using the design shape 1100 as an initial mask shape at step 1221. The method may then proceed at step 1222 to identify segments on the design shape (i.e., initial mask shape) that may potentially require mask shape adjustment. For example the method may identify vertices 1101 and 1102 on polygon 1100 as candidates of potentially causing mask movement constraints and therefore proceed to create mask segments 1111 and 1112 by inserting an end point 1113 to split the edge segment between vertices 1101 and 1102. At the next step 1223, according to one embodiment, the method may assign certain attributes of move type to mask segments 1111 and 1112. The attributes of move type, for example attributes of a rotational move type, reflect the types of movement given to mask segment 1111 and 1112. In addition, mask segments 1111 and 1112 may be given attributes that are different from segment 1114 because of different movement type.

In the meantime, printed image or printed shape may be simulated at step 1229 through an OPC process. Based on the simulation results, the amount of mask segment movement may be calculated at step 1230. Segments 1111 and 1112 are allowed to move, at step 1224, to become new mask segments 1121 and 1122 according to the type of movement being given or assigned at step 1223. At the same time, end point 1113 is moved to end point 1123 and thereby new mask segments 1121 and 1122 forms a triangle shape with the edge segment (before splitting) between vertices 1101 and 1102. The two angles formed between mask segments 1121, and 1122, and the edge segment (between vertices 1101 and 1102) may be restricted preferably around 45 degrees. However, the restriction of forming 45-degree angles is optional and is applied only the ease of handling and/or for lessening of the computational burden and shall not be considered as a must.

In the next OPC mask shape adjustment, edges or mask segments 1121 and 1122 may be moved translationally and/or expanded to become edges 1131 and 1132 with their common end point 1123 being moved to a new end point 1133. In a next step 1225, embodiment of the method may include forming additional mask segments 1134, 1135, 1136, and 1137, as shown in FIG. 11, to fill acute angles or avoid acute angles that otherwise may arise due to mask segments 1121 and 1122 moving to mask segments 1131 and 1132. In other words, acute angles formed by mask segments 1131 and 1132 may be removed or eliminated by introducing new mask segments 1134-1137 covering thereof.

In a next step 1226, the method may pick up other mask segments that may potentially need mask shape adjustment, and assign attributes of appropriate move types. The method may then proceed at step 1227 to perform an OPC process and verify whether certain conditions of the OPC process have been met. Conditions of the OPC process may include, for example, printability of the mask shape. If the OPC conditions have not been met, according to one embodiment, the method of present invention may proceed to simulate a new printed image or printed shape at step 1229 through the OPC process, and to calculate the amount of mask segment movement needed by the mask segments at step 1230. The above process may be repeated until all mask segment candidates for movement are properly adjusted and OPC conditions are met at step 1227. In the next step, a final mask shape may be generated, with mask segments of 1141-1147 as shown in FIG. 11, and provided by the method as output at step 1228. As described above, the final mask shape with mask segments 1141-1147 shall be associated with the initial mask shape 1100. The association of the newly formed mask shape may be made through the "closest projection" rule, which is similar to the rules described in U.S. Pat. No. 6,928,634 by Granik, et al. The content of U.S. Pat. No. 6,928,634 is hereby incorporated by reference.

It shall be noted that the above described OPC process with mask shape adjustments has been experimentally conducted on "Manhattan type" mask shapes which produced 45-degree rotated or octagon type mask shapes on a 45 nm contact level SRAM design. In the experiment, one square contact was restricted by two rectangular shaped contacts. As a result, better printed image was achieved which illustrates the feasibility of principles of the present invention.

Figure 13:
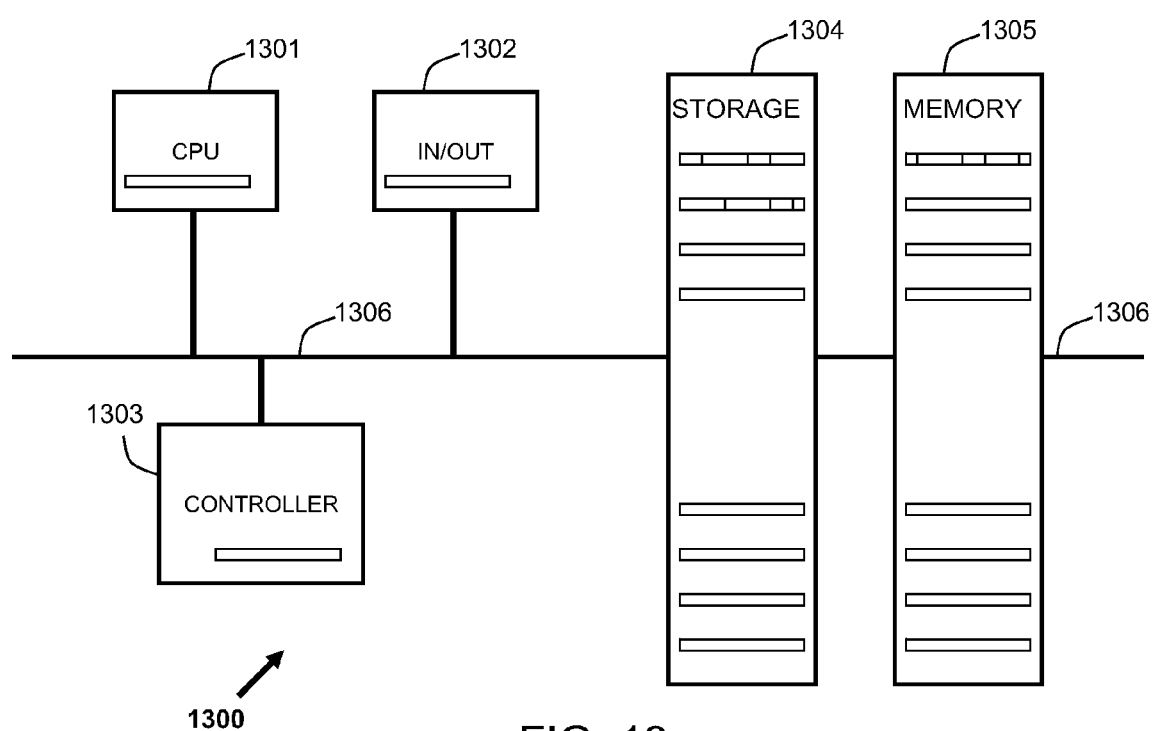
FIG. 13 is a demonstrative illustration of a computing system adapted to perform mask shape adjustment according to embodiments of the present invention.

Methods of mask shape adjustment as described above, according to embodiments of the present invention, may be implemented in a machine, a computer, or a computing system. For example, FIG. 13 is a simplified diagram illustration of a computer or computing system 1300 according to one embodiment of the present invention. Computer or computing system 1300 may include, inter alia, a central processing unit (CPU) 1301 for data processing; one or more input/output (I/O) devices 1302 such as, for example, a keyboard, a mouse, a compact disk (CD) drive, a display device, or a combination thereof or the like for accepting instructions and/or input from an operator or user and for outputting results from CPU 1301 that processes data during simulation or computation; a controller 1303 capable of controlling operation of computing system 1300; one or more storage devices or media 1304 capable of reading and/or writing computer readable code; and a memory device or medium 1305—all of which are operationally connected, for example, via a bus or a wired or wireless communications network (1306). Further more, embodiments of the present invention may be implemented as a computer program product stored on a computer readable medium such as, for example, storage device 1304 or memory device 1305. The computer program product or machine-readable medium may contain instructions which, when being executed, may implement embodiments of the method on computing system 1300 for performing or making mask shape adjustment according to present invention. Finally, the present invention may also be implemented in a plurality of distributed computers wherein elements of computing system, such as elements 1301-1305, may reside in close physical proximity or distributed over a large geographic region and connected by a communications network.

While certain features of the invention have been illustrated and described herein, many modifications, substitutions, changes, and equivalents will now occur to those of ordinary skill in the art. It is, therefore, to be understood that the appended claims are intended to cover all such modifications and changes as fall within the spirit of the invention.

What is claimed is:

1. A method of making mask shape adjustment, the method comprising:
creating a first mask shape;
identifying one or more mask segments of said first mask shape as candidate mask segments of needing segment adjustment;
applying an optical proximity correction (OPC) process, by using a computer, to said first mask shape, said OPC process identifying at least one of said candidate mask segments as a constrained mask segment;
applying a rotational adjustment to said constrained mask segment; and
creating a second mask shape having said constrained mask segment being rotationally adjusted,
wherein applying said rotational adjustment to said constrained mask segment comprises splitting said constrained mask segment into two new mask segments having a common end point at a middle of said constrained mask segment; moving said common end point outwards, normal to said constrained mask segment, to cause said two new mask segments to expand and rotate in opposite directions, said two new mask segments forming a triangle shape with said constrained mask segment before splitting.

2. The method of claim 1, wherein applying said rotational adjustment comprises assigning attributes of a rotational move type to said constrained mask segment, and subsequently moving said constrained mask segment according to said attributes of said rotational move type.

3. The method of claim 1, wherein applying said OPC process comprises optically simulating a printed image using said first mask shape; calculating an amount of move needed by each of said candidate mask segments based upon said simulated printed image; and moving said candidate mask segments according to said amount of move calculated and allowed by conventional OPC rules.

4. The method of claim 3, wherein identifying said constrained mask segment comprises finding at least one of said candidate mask segments that encounters movement constrains imposed by said conventional OPC rules when moving according to said amount of move calculated by said OPC process.

5. The method of claim 1, wherein applying said rotational adjustment to said constrained mask segment comprises rotationally move said constrained mask segment such that constrains encountered by said constrained mask segment with one or more neighboring mask shapes during said OPC process is at least partially removed.

6. The method of claim 1, wherein two angles formed by each of said two new mask segments with said constrained mask segment before splitting are each substantially close to 45 degrees.

7. The method of claim 1, further comprising expanding and making translational move of said two new mask segments; and covering at least one acute angle formed by said expanded two new mask segments by introducing one or more additional mask segments thereupon.

8. The method of claim 1, wherein applying said rotational adjustment to said constrained mask segment comprises expanding and making translational move of said constrained mask segment to create an expanded mask segment; splitting said expanded mask segment into two new mask segments having a common end point; and rotating at least one of said two new mask segments at said common end point by a predetermined degrees.

9. The method of claim 1, wherein said first mask shape is created from a design shape input.

10. The method of claim 1, wherein said one or more mask segments comprise one or more edge segments of said first mask shape.

11. The method of claim 1, further comprising:
identifying one or more new mask segments of said second mask shape as new candidate mask segments of needing segment adjustment;
applying said OPC process to said second mask shape, said OPC process identifying at least one of said new candidate mask segments as a new constrained mask segment;
applying a new rotational adjustment to said new constrained mask segment; and
creating a third mask shape having said new constrained mask segment being rotationally adjusted.

12. The method of claim 11, further comprising:
verifying whether a set of conditions of said OPC process have been met; and providing a final mask shape output when said set of conditions are met, wherein said set of conditions being conditions for printability.

13. A system of performing mask shape adjustment, the system comprising:
a central processing unit (CPU);
at least one input/output device for interacting with a user of said system;
at least one storage device for storing a set of instructions; and
a controller for controlling said CPU; said at least one input/output device; and said at least one storage device via a communication bus,
wherein said CPU is adapted to execute said set of instructions for:
creating a first mask shape;
identifying one or more mask segments of said first mask shape as candidate mask segments of needing segment adjustment;
applying an optical proximity correction (OPC) process to said first mask shape, said OPC process identifying at least one of said candidate mask segments as a constrained mask segment;
applying a rotational adjustment to said constrained mask segment; and
creating a second mask shape having said constrained mask segment being rotationally adjusted,
wherein applying said rotational adjustment to said constrained mask segment comprises splitting said constrained mask segment into two new mask segments having a common end point at a middle of said constrained mask segment; moving said common end point outwards, normal to said constrained mask segment, to cause said two new mask segments to expand and rotate in opposite directions, said two new mask segments forming a triangle shape with said constrained mask segment before splitting.

14. The system of claim 13, wherein applying said rotational adjustment comprises assigning attributes of a rotational move type to said constrained mask segment, and subsequently moving said constrained mask segment according to said attributes of said rotational move type.

15. The system of claim 13, wherein applying said OPC process comprises optically simulating a printed image using said first mask shape; calculating an amount of move needed by each of said candidate mask segments based upon said simulated printed image; and moving said candidate mask segments according to said amount of move calculated and allowed by conventional OPC rules.

16. The system of claim 15, wherein identifying said constrained mask segment comprises finding at least one of said candidate mask segments that encounters movement constrains imposed by said conventional OPC rules when moving according to said amount of move calculated by said OPC process.

17. The system of claim 13, wherein applying said rotational adjustment to said constrained mask segment comprises rotationally move said constrained mask segment such that constrains encountered by said constrained mask segment with one or more neighboring mask shapes during said OPC process is at least partially removed.

18. The system of claim 13, wherein two angles formed by each of said two new mask segments with said constrained mask segment before splitting are each substantially close to 45 degrees.

19. The system of claim 13, further comprising expanding and making translational move of said two new mask segments; and covering at least one acute angle formed by said expanded two new mask segments by introducing one or more additional mask segments thereupon.

20. A non-transitory machine-readable medium having stored thereon a set of instructions that, when executed by a machine, result in
creating a first mask shape;
identifying one or more mask segments of said first mask shape as candidate mask segments of needing segment adjustment;
applying an optical proximity correction (OPC) process to said first mask shape, said OPC process identifying at least one of said candidate mask segment as a constrained mask segment;
applying a rotational adjustment to said constrained mask segment; and
creating a second mask shape having said constrained mask segment being rotationally adjusted,
wherein applying said rotational adjustment to said constrained mask segment comprises splitting said constrained mask segment into two new mask segments having a common end point at a middle of said constrained mask segment; moving said common end point outwards, normal to said constrained mask segment, to cause said two new mask segments to expand and rotate in opposite directions, said two new mask segments forming a triangle shape with said constrained mask segment before splitting.

21. The non-transitory machine-readable medium of claim 20, wherein applying said rotational adjustment comprises assigning attributes of a rotational move type to said constrained mask segment, and subsequently moving said constrained mask segment according to said attributes of said rotational move type.

22. The non-transitory machine-readable medium of claim 20, wherein applying said OPC process comprises optically simulating a printed image using said first mask shape; calculating an amount of move needed by each of said candidate mask segments based upon said simulated printed image; and moving said candidate mask segments according to said amount of move calculated and allowed by conventional OPC rules.

23. The non-transitory machine-readable medium of claim 22, wherein identifying said constrained mask segment comprises finding at least one of said candidate mask segments that encounters movement constrains imposed by said conventional OPC rules when moving according to said amount of move calculated by said OPC process.

24. The non-transitory machine-readable medium of claim 20, wherein two angles formed by each of said two new mask segments with said constrained mask segment before splitting are substantially close to 45 degrees.

* * * * *